United States Patent
Look et al.

(10) Patent No.: US 7,504,854 B1
(45) Date of Patent: Mar. 17, 2009

(54) REGULATING UNUSED/INACTIVE RESOURCES IN PROGRAMMABLE LOGIC DEVICES FOR STATIC POWER REDUCTION

(75) Inventors: Kevin T. Look, Fremont, CA (US); Michael J. Hart, Palo Alto, CA (US); Tim Tuan, San Jose, CA (US); Kameswara K. Rao, San Jose, CA (US); Robert O. Conn, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 1234 days.

(21) Appl. No.: 10/783,589

(22) Filed: Feb. 20, 2004

Related U.S. Application Data

(63) Continuation-in-part of application No. 10/666,669, filed on Sep. 19, 2003, now Pat. No. 7,098,689.

(51) Int. Cl.
*H03K 19/173* (2006.01)
*G11C 5/14* (2006.01)

(52) U.S. Cl. .............................. 326/38; 326/49; 326/80
(58) Field of Classification Search .................... 326/38, 326/44, 49, 80, 81; 365/226, 227, 229
See application file for complete search history.

(56) References Cited

U.S. PATENT DOCUMENTS

| | | | |
|---|---|---|---|
| 4,962,341 A | 10/1990 | Schoeff | |
| 5,303,390 A | 4/1994 | Little | |
| 5,362,989 A | 11/1994 | Hennedy | |
| 5,519,663 A | 5/1996 | Harper et al. | |
| 5,568,062 A * | 10/1996 | Kaplinsky | ..................... 326/27 |
| 5,583,457 A | 12/1996 | Horiguchi | |
| 5,612,892 A | 3/1997 | Almulla | |
| 5,615,162 A * | 3/1997 | Houston | ..................... 365/226 |
| 5,671,149 A | 9/1997 | Brown | |
| 5,682,107 A | 10/1997 | Tavana et al. | |
| 5,712,790 A | 1/1998 | Ditlow | |
| 5,801,548 A | 9/1998 | Lee et al. | |
| 5,811,962 A | 9/1998 | Ceccherelli | |
| 5,825,662 A | 10/1998 | Trimberger | |

(Continued)

OTHER PUBLICATIONS

U.S. Appl. No. 10/377,857, filed Feb. 28, 2003, Blodget et al.

(Continued)

*Primary Examiner*—Daniel D Chang
(74) *Attorney, Agent, or Firm*—E. Eric Hoffman

(57) ABSTRACT

A method of operating a programmable logic device, including the steps of using a full $V_{DD}$ supply voltage to operate one or more active blocks of the programmable logic device, and using a reduced supply voltage (e.g., ½ $V_{DD}$) to operate one or more inactive blocks of the programmable logic device. The full VDD supply voltage and reduced supply voltage can be provided to the blocks of the programmable logic device through high-voltage n-channel transistors. A boosted voltage, greater than VDD, is applied to the gate of an n-channel transistor to provide the full VDD supply voltage to an active block. A standby voltage, less than VDD, is applied to the gate of an n-channel transistor to provide the reduced supply voltage to an inactive block. The inactive blocks can be determined during run time and/or design time of the programmable logic device.

18 Claims, 5 Drawing Sheets

U.S. PATENT DOCUMENTS

| | | | |
|---|---|---|---|
| 5,832,286 | A | 11/1998 | Yoshida |
| 5,914,873 | A | 6/1999 | Blish |
| 5,946,257 | A * | 8/1999 | Keeth .................. 365/226 |
| 5,958,026 | A | 9/1999 | Goetting et al. |
| 6,038,386 | A | 3/2000 | Jain |
| 6,114,843 | A * | 9/2000 | Olah .................. 323/280 |
| 6,148,390 | A | 11/2000 | MacArthur et al. |
| 6,160,418 | A | 12/2000 | Burnham |
| 6,169,419 | B1 | 1/2001 | De et al. |
| 6,172,518 | B1 | 1/2001 | Jenkins, IV. et al. |
| 6,208,171 | B1 | 3/2001 | Kumagai et al. |
| 6,384,626 | B2 | 5/2002 | Tsai et al. |
| 6,466,049 | B1 | 10/2002 | Diba et al. |
| 6,489,804 | B1 | 12/2002 | Burr |
| 6,583,645 | B1 | 6/2003 | Bennett et al. |
| 6,631,502 | B2 | 10/2003 | Buffet et al. |
| 6,710,612 | B2 | 3/2004 | Farnworth et al. |
| 6,711,719 | B2 | 3/2004 | Cohn et al. |
| 6,747,478 | B2 | 6/2004 | Madurawe |
| 6,839,888 | B2 | 1/2005 | Gupta |
| 6,885,563 | B2 | 4/2005 | Panella |
| 6,920,627 | B2 | 7/2005 | Blodget et al. |
| 6,936,917 | B2 | 8/2005 | Lopata et al. |
| 6,950,998 | B1 | 9/2005 | Tuan |
| 6,960,934 | B2 | 11/2005 | New |
| 6,968,467 | B2 | 11/2005 | Inoue et al. |
| 7,003,620 | B2 | 2/2006 | Avraham et al. |
| 7,078,932 | B2 | 7/2006 | Swami |
| 7,080,341 | B2 | 7/2006 | Eisenstadt et al. |
| 7,098,689 | B1 | 8/2006 | Tuan et al. |
| 7,109,748 | B1 | 9/2006 | Liu et al. |
| 7,112,997 | B1 | 9/2006 | Liang et al. |
| 7,135,886 | B2 | 11/2006 | Schlacter |
| 7,170,315 | B2 | 1/2007 | Bakker et al. |
| 7,313,708 | B2 | 12/2007 | Oshins |
| 7,345,944 | B1 | 3/2008 | Jenkins |
| 2003/0030326 | A1 | 2/2003 | Shenai et al. |
| 2003/0218478 | A1 | 11/2003 | Sani et al. |
| 2004/0145955 | A1 | 7/2004 | Mizuno et al. |
| 2005/0091547 | A1 | 4/2005 | Hanrieder et al. |
| 2005/0201174 | A1 | 9/2005 | Klein |
| 2006/0053246 | A1 | 3/2006 | Lee |
| 2006/0069851 | A1 | 3/2006 | Chung et al. |
| 2006/0202713 | A1 | 9/2006 | Shumarayev |
| 2007/0001720 | A1 | 1/2007 | Li et al. |
| 2007/0164785 | A1 | 7/2007 | He |

OTHER PUBLICATIONS

U.S. Appl. No. 10/783,216, filed Feb. 20, 2004, Tuan et al.
Takahashi, M. et al.; "A 60-mW MPEG4 Video Codec Using Clustered Voltage Scaling with Variable Supply-Voltage Scheme," Nov. 1998, pp. 1772-1780, vol. 33, No. 11, available from IEEE Journal of Solid-State Circuits, IEEE, 3 Park Avenue, 17th Floor, New York, NY 10016-5997.
Allen/Holberg, Chapter 10; "Bandgap Voltage Reference"; Apr. 12, 2000; downloaded on Jan. 3, 2006 from www.ece.utexas.edu/~holberg/lecture_notes/bandgap.pdf; pp. 1-5.
Intel Corporation, "Intel PXA27x Processor Family Power Requirements", Application Note, 2004, pp. 1-36, available from Intel Corporation (Santa Clara) Corporate Office, 2200 Mission College Blvd., Santa Clara, California 95052-8119.
Microchip Technology Inc.; "Micropower Voltage Supervisors"; MCP 102/103/121/131; Copyright 2005; downloaded on Jan. 3, 2006 from ww1.microchip.com/downloads/en/DeviceDoc/21906b.pdf; pp. 1-28.
Nowka, Kevin J., A 32-bit PowerPC System-on-a-Chip With Support For Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.
Texas-Instruments—Datasheet BQ4011 (32×8 nonvolatile SRAM) May 1999 pp. 1-15.
Texas Instruments (BenchMARq)—Datasheet BQ4011 (32×8 nonvolatile SRAM) Aug. 1993 pp. 1-11.
Xilinx, Inc., "Spartan-3L Low Power FPGA Family", Preliminary Product Specification, DS313, Sep. 15, 2005, v1.1, pp. 1-10, available from Xilinx, Inc., 2100 Logic Drive, San Jose, CA 95124.-3L.
Xilinx, Inc., "Virtex-II Pro Platform FPGA Handbook"; published Oct. 14, 2002; available from Xilinx, Inc., 2100 Logic Drive, San Jose, CA 95124; pp. 19-71.
U.S. Appl. No. 11/502,939, filed Aug. 11, 2006, Tuan, Tim, et al., entitled "Disabled Unused/Inactive Resources in Programmable Logic Devices for Static Power Reduction", Xilinx, Inc., San Jose, CA 95124.
U.S. Appl. No. 11/326,542, filed Jan. 4, 2006, Jacobson, Neil G. et al., entitled "Method and Mechanism for Controlling Power Consumption of an Integrated Circuit", Xilinx, Inc., San Jose, CA.
U.S. Appl. No. 11/325,888, filed Jan. 4, 2006, Tuan, Tim, entitled "Programmable Low Power Modes For Embedded Memory Blocks", Xilinx Inc., San Jose, CA.
U.S. Appl. No. 11/268,265, filed Nov. 4, 2005, Rahman, Arifur, et al. entitled "Implementation of Low Power Standby Modes For Integrated Circuits", Xilinx, Inc., San Jose, CA.
U.S. Appl. No. 10/971,934, filed Oct. 22, 2004, Jenkins, Jesse H. IV, entitled "Low Power Zones For Programmable Logic Devices", Xilinx, Inc., San Jose, CA 95124.
U.S. Appl. No. 10/783,216, filed Feb. 20, 2004, Tuan, Tim et al., entitled "Tuning Programmable Logic Devices for Low-Power Design Implementation", Xilinx, Inc., San Jose, CA 95124.
U.S. Appl. No. 10/606,619, filed Jun. 26, 2003, New et al.
He, Lei; "Power Efficient FPGA: Circuit, Fabrics and CAD Algorithms," Presentation on Feb. 13, 2004, 50 pages, at Xilinx, Inc. 2100 Logic Drive, San Jose, CA 95124, available from EE Department, UCLA, at http:/ /eda.ee.ucla.edu/.
FPGA 2004 Advance Program; ACM/SIGDA Eleventh international Symposium on Field Programmable Gate Arrays, Feb. 22-24, 2004, 6 pages, at Monterey Beach Hotel, Monterey, California, available at http://fpga2004.ece.ubc.ca/.
Inukai, T. et al., "Boosted Gate MOS (BGMOS): Device/Circuit Cooperation Scheme to Achieve Leakage-Free Giga-Scale Integration," 2000, pp. 409-412, available from IEEE Journal of Solid-State Circuits, IEEE, 3 Park Avenue, 17th Floor, New York, NY 10016-5997.
Hamzaoglu, F. et al., "Circuit-Level Techniques to Control Gate Leakage for sub-100nm CMOS," ISLPED, Aug. 12-14, 2002, pp. 60-63, available from IEEE Journal of Solid-State Circuits, IEEE, 3 Park Avenue, 17th Floor, New York, NY 10016-5997.
Kuroda, T., et al., A 0.9V, 150-MHz, 1—mW, 4 $mm^2$2-D Discrete Cosine Transform Core Processor with Variable Threshold-Voltage (VT) Scheme, 1996, pp. 1770-1779, vol. 31, No. 11, available from IEEE Journal of Solid-State Circuits, IEEE, 3 Park Avenue, 17th Floor, New York, NY 10016-5997.
Mutoh, S. et al., "1-V Power Supply High-Speed Digital Circuit Technology with Multithreshold-Voltage CMOS," Aug. 1995, pp. 847-854, vol. 30, No. 8, available from IEEE Journal of Solid-State Circuits, 3 Park Avenue, 17th Floor, New York, NY 10016-5997.
Jae Y. Park, Mark G. Allen; "A Comparison of Micromachined Inductors with Different Magnetic Core Materials"; 1996 Electronic Components and Technology Conference; 1996 IEEE; pp. 375-381.
Thomas D. Burd et al.; "A Dynamic Voltage Scaled Microprocessor System"; 2000 IEEE; IEEE Journal of Solid-State Circuits, vol. 35, No. 11, Nov. 2000; pp. 1571-1580.
Anthony J. Stratakos et al.; "A Low-Voltage CMOS DC-DC Converter for a Portable Battery-Operated System"; 1994 IEEE; pp. 619-626.
Anthony John Stratakos; "High-Efficiency Low-Voltage DC-DC Conversion for Portable Applications," Chapter 3; "DC-DC Converter Fundamentals"; pp. 42-78, no date.
US 6,981,160, 12/2005, Thaker et al. (withdrawn)

* cited by examiner

REGULATING UNUSED/INACTIVE RESOURCES IN PROGRAMMABLE LOGIC DEVICES FOR STATIC POWER REDUCTION

RELATED APPLICATION

The present application is a continuation-in-part of U.S. patent application Ser. No. 10/666,669 filed by Tim Tuan, Kameswara K. Rao and Robert O. Conn on Sep. 19, 2003, which is incorporated herein in its entirety.

FIELD OF THE INVENTION

The present invention relates to the regulation of the supply voltage provided to unused and/or inactive blocks in a programmable logic device to achieve lower static power consumption. More specifically, the present invention relates to selectively reducing the operating voltage of various sections of an integrated circuit device in order to reduce the leakage current and/or increase the performance of the device.

RELATED ART

Improved performance in integrated circuits requires technology scaling. As technology is scaled, the physical dimensions of transistors, such as gate oxide thickness and transistor gate length, are reduced. The operating voltage of the transistor must scale to maintain an acceptable electric field across the gate oxide to maintain acceptable reliability. Lowering the operating voltage requires that the threshold voltage of the transistor be reduced. Transistor off-state leakage current consists of sub-threshold leakage, gate direct tunnel current, and band-to-band tunnel leakage current. The relationship of transistor off-state leakage currents with respect to device scaling is shown by Inukai, et al., in "Boosted Gate MOS (BGMOS): Device/Circuit Cooperation Scheme to Achieve Leakage-Free Giga-Scale Integration", IEEE Custom Integrated Circuit Conference, 19-2-1, 2000.

Inukai et al. teach that the sub-threshold leakage of the transistor becomes increasing large from one technology node to the next technology. At the same time, the gate leakage current of the transistor also increases as a result of reduction in gate oxide thickness. It has been reported that the gate leakage current increases by an order of magnitude for each 2 Angstrom reduction in gate oxide thickness. (Hamzaoglu et al., "Circuit-Level Techniques to Control Gate Leakage for sub-100 nm CMOS", ISLPED. p. 60-63, August, 2002.) Inukai et al. project that the gate leakage current will exceed the sub-threshold leakage current and become the dominating factor in leakage at some technology node. Therefore, standby power becomes more and more problematic in technology scaling.

Circuit techniques to suppress leakage currents have been proposed in the literature. Kuroda et al. propose a VTMOS technique to suppress standby leakage current in "0.9V. 150-MHz, 10-mW, 4 mm², 2-D discrete cosine transform core processor with variable threshold-voltage (VT) scheme", IEEE Journal of Solid-State Circuits, vol. 31. pp. 1770-1779, 1996. In this VTMOS technique, the transistor is back-biased to raise the threshold voltage of the transistor in a standby mode. This technique can reduce the transistor sub-threshold leakage current, but does not reduce the gate tunneling leakage current.

Mutoh et al. propose an MTMOS technique in "I-V Power Supply High-Speed Digital Circuit Technology With Multi-Threshold Voltage CMOS", IEEE Journal of Solid-State Circuit, vol. 30, pp. 847-854, 1995. This MTMOS technique uses a transistor having a high threshold voltage (Vt) to supply a virtual $V_{DD}$ supply voltage and a ground supply voltage to core circuitry. The high Vt transistor has the same gate oxide thickness as transistors in the core circuitry, but is less leaky. However, the MTMOS technique faces a similar problem as the VTMOS technique. That is, the MTMOS technique does not reduce gate leakage current.

Inukai et al. propose a BGMOS technique. The BGMOS technique uses a thicker oxide transistor as a power switch to shut-off the leakage path in a standby mode. However, the disadvantage of this technique is that the stored data are lost in standby mode. Inukai et al. propose adding a memory cell to store the data in standby mode. However, this proposed solution results in a significant increase in area penalty.

It would therefore be desirable to have a technique that can reduce both the gate tunneling leakage and sub-threshold leakage while maintaining the circuit state without significantly increasing the area penalty for the upcoming technology node.

Note that programmable logic devices (PLDs), such as field programmable gate arrays (FPGAs), have a significantly higher static power consumption than dedicated logic devices, such as standard-cell application specific integrated circuits (ASICs). A reason for this high static power consumption is that for any given design, a PLD only uses a subset of the available resources. The unused resources are necessary for providing greater mapping flexibility to the PLD. However, these unused resources still consume static power in the form of leakage current. Consequently, PLDs are generally not used in applications where low static power is required.

It would therefore be desirable to have a PLD having a reduced static power consumption.

SUMMARY

In accordance with one embodiment of the present invention, unused and/or inactive resources in a PLD are disabled to achieve lower static power consumption.

One embodiment of the present invention provides a method of operating a PLD, which includes the steps of enabling the resources of the PLD that are used in a particular circuit design, and disabling the resources of the PLD that are unused or inactive. The step of disabling can include decoupling the unused or inactive resources from one or more power supply terminals. Alternately, the step of disabling can include regulating (e.g., reducing) a supply voltage applied to the unused or inactive resources.

In accordance with one embodiment, the step of disabling can be performed in response to configuration data bits stored by the PLD. These configuration data bits can be determined during the design of the circuit to be implemented by the PLD. That is, during the design, the design software is able to identify unused resources of the PLD, and select the configuration data bits to disable these unused resources.

The step of disabling can also be performed in response to user-controlled signals. These user-controlled signals can be generated in response to observable operating conditions of the PLD. For example, if certain resources of the operating PLD are inactive for a predetermined time period, then the user-controlled signals may be activated, thereby causing the inactive resources to be disabled.

In accordance with another embodiment, a PLD includes a first voltage supply terminal that receives a first supply voltage, a plurality of programmable logic blocks, and a plurality of switch elements, wherein each switch element is coupled between one of the programmable logic blocks and the first voltage supply terminal. A control circuit coupled to the switch elements provides a plurality of control signals that selectively enable or disable the switch elements. The control circuit can be controlled by a plurality of configuration data values stored by the PLD and/or a plurality of user-controlled signals.

In an alternate embodiment, each of the switch elements can be replaced by a switching regulator. In accordance with one embodiment, the switching regulator can be a high-voltage n-channel transistor having a drain coupled to the VDD voltage supply and a source coupled to the programmable logic block. The gate of the high voltage transistor is coupled to receive a control voltage from a corresponding control circuit. The control circuit determines whether the corresponding programmable logic block is in an active or inactive state in response to user controlled signals and/or configuration data bits. When the programmable logic block is active, the control circuit applies a high control voltage $V_{BOOST}$, which is greater than the $V_{DD}$ supply voltage, to the gate of the high voltage transistor, such that the full $V_{DD}$ supply voltage is applied to the programmable logic block. When the programmable logic block is inactive, the control circuit applies a low control voltage $V_{STANDBY}$, which is less than the $V_{DD}$ supply voltage, to the gate of the high voltage transistor, such that a voltage of about one half the $V_{DD}$ supply voltage is applied to the programmable logic block. A feedback mechanism can be employed to ensure that the voltage applied to the programmable logic block is precisely equal to one half the $V_{DD}$ supply voltage.

The present invention will be more fully understood in view of the following description and drawings.

DETAILED DESCRIPTION

In accordance with one embodiment of the present invention, unused and inactive resources in a programmable logic device (PLD), such as a field programmable gate array (FPGA), are disabled to achieve lower static power consumption. The present invention includes both an enabling software flow and an enabling hardware architecture, which are described in more detail below. Unused resources of the PLD can be disabled when designing a particular circuit to be implemented by the PLD (hereinafter referred to as "design time"). In addition, resources of the PLD that are temporarily inactive can be disabled during operation of the PLD (hereinafter referred to as "run time").

Figure 1:
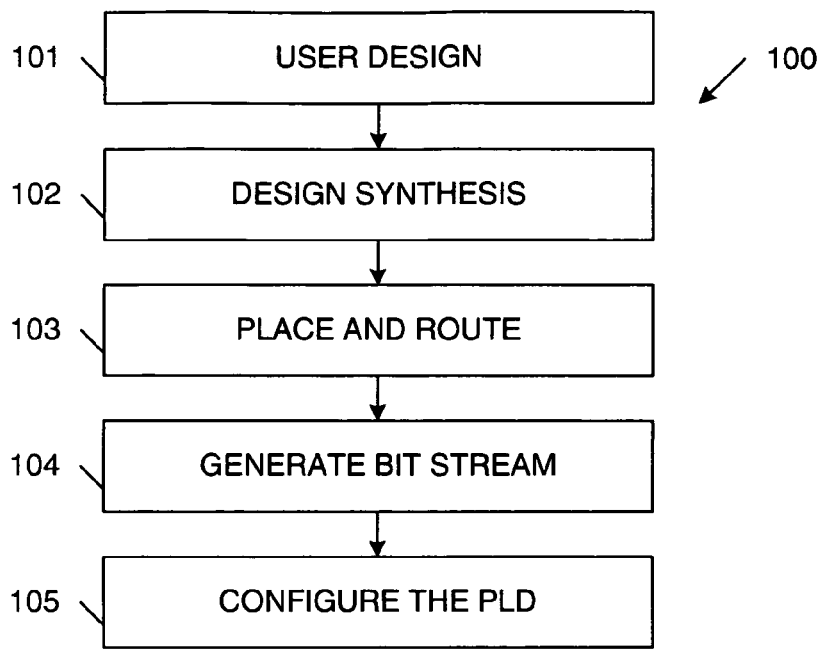
FIG. 1 is a flow diagram illustrating a conventional design flow used for PLDs.

FIG. 1 is a flow diagram 100 illustrating a conventional design flow used for PLDs. Initially, a user designs a circuit to be implemented by the PLD (Step 101). This user design is described in a high-level specification, such as Verilog or VHDL. The high-level specification is first synthesized to basic logic cells available on the PLD (Step 102). A place and route process then assigns every logic cell and wire in the design to some physical resource in the PLD (Step 103). The design is then converted into a configuration bit stream, in a manner known to those of ordinary skill in the art (Step 104). The configuration bit stream is then used to configure the device by setting various on-chip configuration memory cells (Step 105). While modern design flows may be much more complex, they all involve the basic steps defined by flow diagram 100.

In accordance with the present invention, unused resources of the PLD are identified during the design time, following the place and route process (Step 103). These unused resources are then selectively disabled during the design time. As described below, there are several ways to disable the unused resources. By selectively disabling the unused resources at design time, significant static power reduction may be achieved with no performance penalty.

Figure 2:
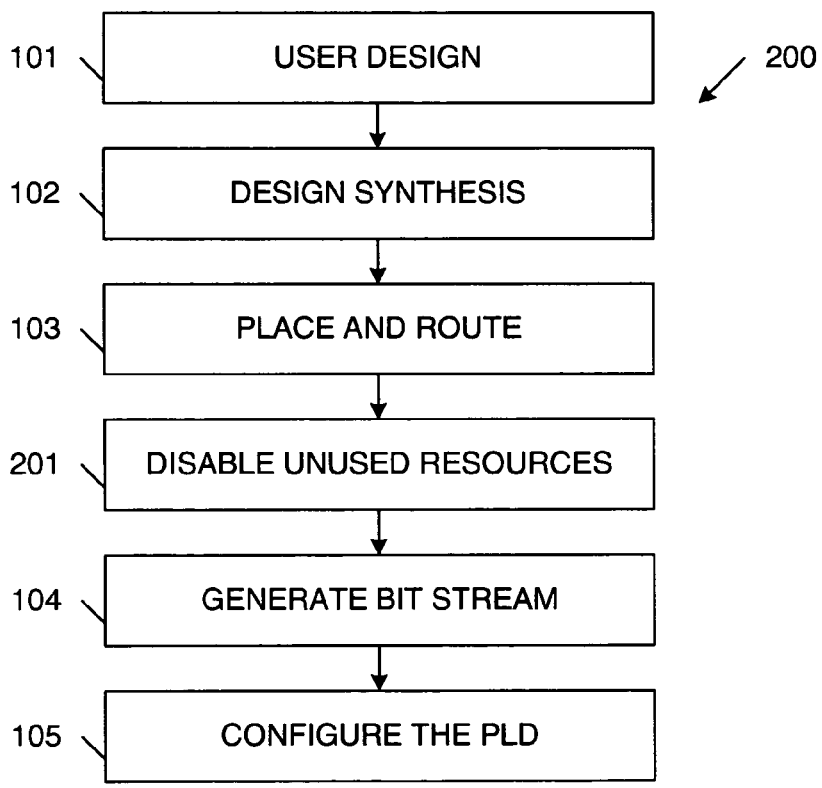
FIG. 2 is a flow diagram illustrating a design flow for a PLD in accordance with one embodiment of the present invention.

FIG. 2 is a flow diagram 200 illustrating a design flow in accordance with one embodiment of the present invention. Similar steps in flow diagrams 100 and 200 are labeled with similar reference numbers. Thus, flow diagram 200 includes Steps 101-105 of flow diagram 100, which are described above. In addition, flow diagram 200 includes the step of disabling unused resources in the PLD (Step 201). This step of disabling unused resources is performed after the place and route process has been completed in Step 103, and before the configuration bit stream is generated in Step 104. As described in more detail below, the unused resources are disabled by disabling predetermined programmable logic blocks of the PLD.

In another embodiment, further power savings are obtained by disabling temporarily inactive resources of the configured PLD during run time. Often, the entire design or parts of the design are temporarily inactive for some period of time. If the inactive period is sufficiently long, it is worthwhile to disable the inactive resources to reduce static power consumption. In a preferred embodiment, the decision of when to disable a temporarily inactive resource is made by the designer. In this embodiment, the user logic is provided access to a disabling mechanism, which enables the inactive resources to be disabled dynamically.

There are a number of techniques to disable resources in a PLD. In accordance with one embodiment, the PLD is logically subdivided into a plurality of separate programmable logic blocks. As described below, each programmable logic block may comprise one or more of the resources available on the programmable logic device. Switch elements are used to couple each of the programmable logic blocks to one or more associated voltage supply terminals (e.g., $V_{DD}$ or ground). The switch elements are controlled to perform a power-gating function, wherein unused and/or inactive programmable logic blocks are disabled (e.g., prevented from receiving power or receiving a reduced power). Preferably, only one of the voltage supply terminals ($V_{DD}$ or ground) is power-gated, thereby reducing the speed and area penalties associated with the switch elements. When the switch elements are controlled to de-couple the associated programmable logic blocks from the associated supply voltage, these programmable logic blocks are effectively disabled, thereby dramatically reducing the static power consumption of these blocks.

Figure 3:
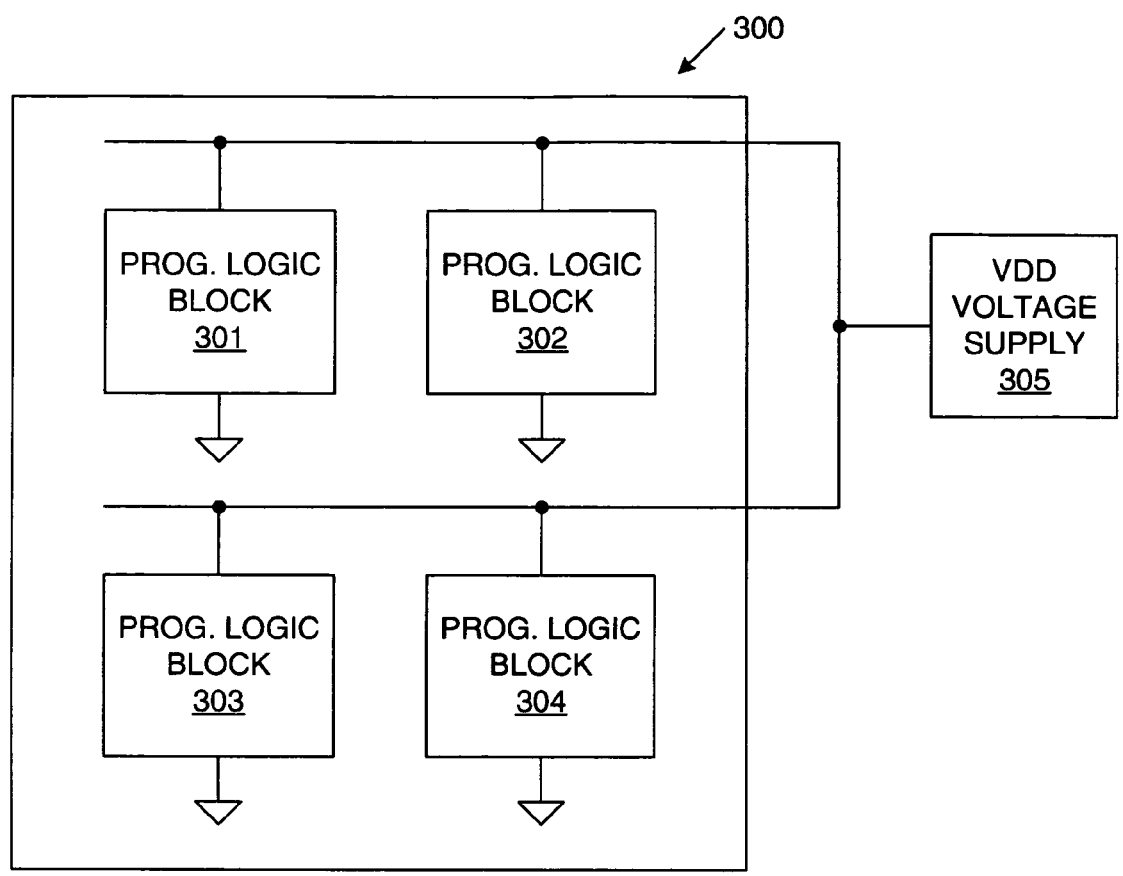
FIG. 3 is a block diagram of a conventional PLD having four blocks, which are all powered by the same off-chip $V_{DD}$ voltage supply.

FIG. 3 is a block diagram of a conventional PLD 300 having four programmable logic blocks 301-304, which are all powered by the same off-chip $V_{DD}$ voltage supply 305.

Note that all four programmable logic blocks 301-304 are coupled to receive the $V_{DD}$ supply voltage during normal operating conditions, even if some of these blocks are not used in the circuit design.

Figure 4:
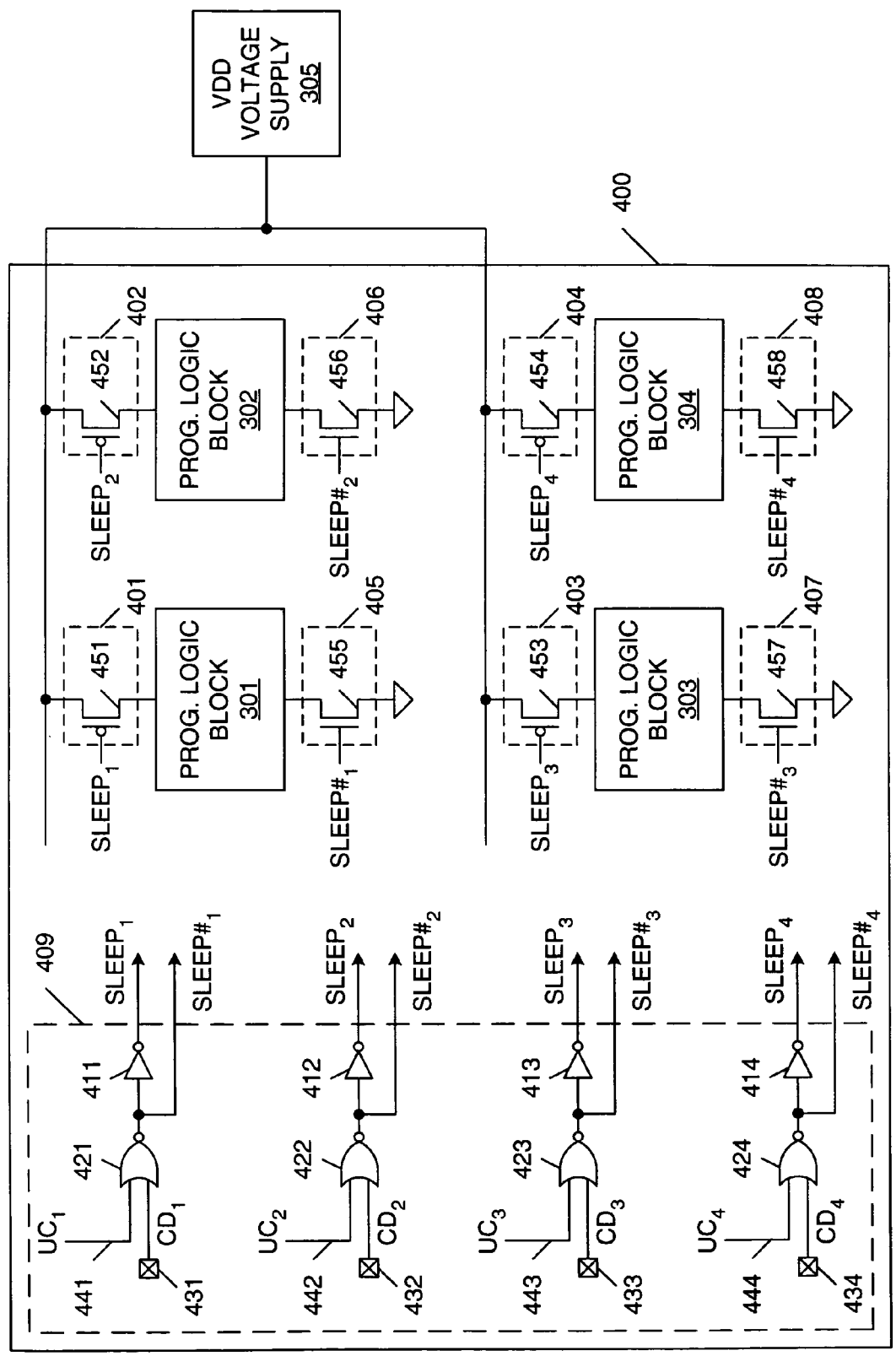
FIG. 4 is a block diagram of a PLD that implements power-gating switch elements in accordance with one embodiment of the present invention.

FIG. 4 is a block diagram of a PLD 400 in accordance with one embodiment of the present invention. Similar elements in FIGS. 3 and 4 are labeled with similar reference numbers. Thus, PLD 400 includes programmable logic blocks 301-304 and $V_{DD}$ voltage supply 305. In addition, PLD 400 includes switch elements 401-408, and control circuit 409. In the described embodiment, switch elements 401-404 are implemented by PMOS power-gating transistors 451-454, respectively, and switch elements 405-408 are implemented by NMOS power-gating transistors 455-458, respectively. In other embodiments, switch elements 401-408 may be any switch known to those ordinarily skilled in the art. Control circuit 409 is implemented by inverters 411-414, NOR gates 421-424, configuration memory cells 431-434, and user logic input terminals 441-444.

NOR gates 421-424 and inverters 411-414 are configured to generate power-gating control signals $SLEEP_1$-$SLEEP_4$ and $SLEEP\#_1$-$SLEEP\#_4$ in response to the configuration data values $CD_1$-$CD_4$ stored in configuration memory cells 431-434, respectively, and the user control signals $UC_1$-$UC_4$ provided on user logic input terminals 441-444, respectively.

For example, NOR gate 421 is coupled to receive configuration data value $CD_1$ from configuration memory cell 431 and user control signal $UC_1$ from user logic input terminal 441. If either the configuration data value $CD_1$ or the user control signal $UC_1$ is activated to a logic high state, then NOR gate 421 provides an output signal ($SLEEP\#_1$) having a logic "0" state. In response, inverter 411, which is coupled to the output terminal of NOR gate 421, provides an output signal ($SLEEP_1$) having a logic "1" state.

The $SLEEP_1$ signal is applied to the gate of PMOS power-gating transistor 451, which is coupled between block 301 and the $V_{DD}$ voltage supply terminal. The $SLEEP\#_1$ signal is applied to the gate of NMOS power-gating transistor 455, which is coupled between block 301 and the ground voltage supply terminal. The logic "0" state of the $SLEEP\#_1$ signal causes NMOS power-gating transistor 455 to turn off, thereby de-coupling block 301 from the ground supply voltage terminal. Similarly, the logic "1" state of the $SLEEP_1$ signal causes PMOS power-gating transistor 451 to turn off, thereby de-coupling block 301 from the $V_{DD}$ supply voltage terminal. De-coupling block 301 from the $V_{DD}$ and ground supply voltage terminals effectively disables block 301, thereby minimizing the static leakage current in this block.

If both the configuration data value $CD_1$ and the user control signal $UC_1$ are de-activated to a logic low state, then NOR gate 421 provides a $SLEEP\#_1$ signal having a logic "1" state, and inverter 411 provides a $SLEEP_1$ signal having a logic "0" state. The logic "1" state of the $SLEEP\#_1$ signal causes NMOS power-gating transistor 455 to turn on, thereby coupling block 301 to the ground supply voltage terminal. Similarly, the logic "0" state of the $SLEEP_1$ signal causes PMOS power-gating transistor 451 to turn on, thereby coupling block 301 to the $V_{DD}$ supply voltage terminal. Coupling block 301 to the $V_{DD}$ and ground supply voltage terminals effectively enables block 301.

Programmable logic block 302 may be enabled and disabled in response to configuration data value $CD_2$ and user control signal $UC_2$, in the same manner as block 301. Similarly, programmable logic block 303 may be enabled and disabled in response to configuration data value $CD_3$ and user control signal $UC_3$, in the same manner as block 301. Programmable logic block 304 may be enabled and disabled in response to configuration data value $CD_4$ and user control signal $UC_4$, in the same manner as block 301.

As described above, when a programmable logic block is used and active, the associated power-gating transistors are turned on. Conversely, when a programmable logic block is unused or inactive, the associated power gating transistors are turned off. The $SLEEP_1$-$SLEEP_4$ and $SLEEP\#_1$-$SLEEP\#_4$ signals can be controlled by the configuration data values $CD_1$-$CD_4$ stored by configuration memory cells 431-434, which are best suited for disabling the associated blocks at design time. If a block is not disabled at design time, this block can be disabled at run time by the user control signals $UC_1$-$UC_4$, which may be generated by the user logic, or by other means.

In accordance with another embodiment of the present invention, some blocks have multiple supply voltages. In this case all of the supply rails should be power-gated to achieve maximum power reduction. In accordance with another embodiment, only one switch element may be associated with each block. That is, the blocks are power-gated by de-coupling the block from only one power supply terminal, and not both the $V_{DD}$ and ground supply voltage terminals, thereby conserving layout area.

The granularity of the power-gated programmable logic blocks can range from arbitrarily small circuits to significant portions of the PLD. The decision concerning the size of each programmable logic block is made by determining the desired trade-off between power savings, layout area overhead of the switch elements and the control circuit, and speed penalty. In a FPGA, each programmable logic block may be selected to include one or more configuration logic blocks (CLBs), input/output blocks (IOBs), and/or other resources of the FPGA (such as block RAM, processors, multipliers, adders, transceivers).

Another way to disable a programmable logic block is by scaling down the local supply voltage to the block as low as possible, which dramatically reduces the power consumption, both static and dynamic, of the block. To scale down the local supply voltage in this manner, each independently controlled programmable logic block is powered by a separate switching regulator.

Figure 5:
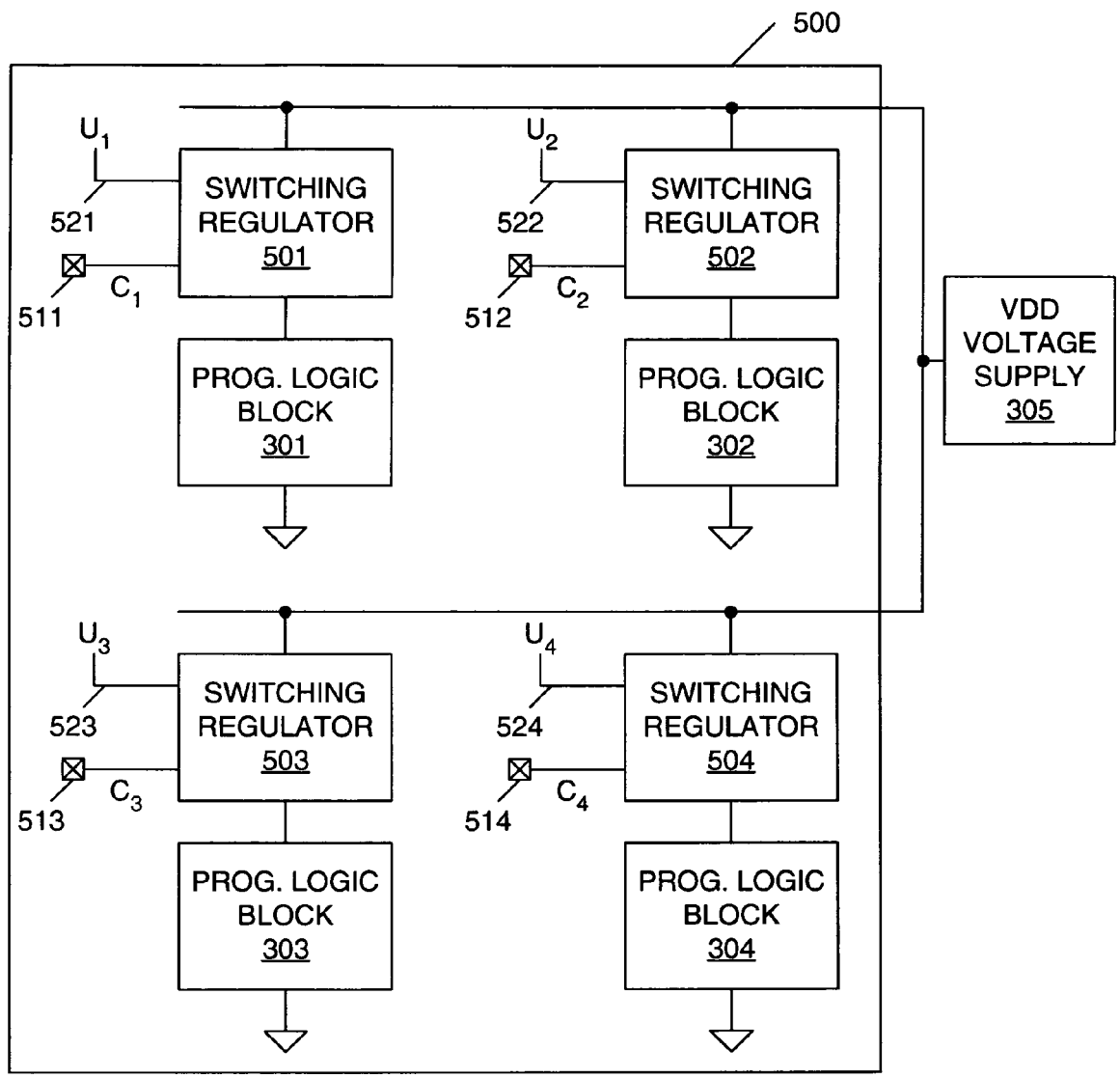
FIG. 5 is a block diagram of a PLD that implements switching regulators in accordance with one embodiment of the present invention.

FIG. 5 is a block diagram of a PLD 500 that implements switching regulators in accordance with one embodiment of the present invention. Similar elements in FIGS. 3 and 5 are labeled with similar reference numbers. Thus, PLD 500 includes programmable logic blocks 301-304 and $V_{DD}$ voltage supply 305. In addition, PLD 500 includes switching regulators 501-504, which are coupled between blocks 301-304, respectively, and $V_{DD}$ voltage supply 305. Switching regulators 501-504 are controlled by control circuits 511-514, respectively. In the described embodiment, switching regulators 501-504 reside on the same chip as blocks 301-304. However, in other embodiments, these switching regulators can be located external to the chip containing blocks 301-304. Switching regulators 501-504 can be programmably tuned to provide the desired supply voltages to the associated programmable logic blocks 301-304. For example, switching regulator 501 can provide a full $V_{DD}$ supply voltage to programmable logic block 301 when this block is used and active. However, switching regulator 501 can further be controlled to provide a reduced voltage (e.g., some percentage of the $V_{DD}$ supply voltage) to programmable logic block 301 when this block is unused or inactive. This reduced voltage may be predetermined (by design or via testing) depending on the desired circuit behavior. For example, this reduced voltage may be the minimum voltage required to maintain the state of the associated blocks. The power consumption of block 301 is significantly reduced when the supplied voltage is reduced in this manner.

Switching regulators 501-504 are controlled in response to the configuration data values $C_1$-$C_4$ stored in configuration memory cells 511-514, respectively, and the user control signals $U_1$-$U_4$ provided on user control terminals 521-524, respectively. A configuration data value (e.g., $C_1$) having an activated state will cause the associated switching regulator (e.g., switching regulator 501) to provide a reduced voltage to the associated programmable logic block (e.g., block 301). Similarly, a user control signal (e.g., $U_2$) having an activated state will cause the associated switching regulator (e.g., switching regulator 502) to provide a reduced voltage to the associated programmable logic block (e.g., block 502). A configuration data value (e.g., $C_3$) and an associated user control signal (e.g., $U_3$) both having have deactivated states will cause the associated switching regulator (e.g., switching regulator 503) to provide the full $V_{DD}$ supply voltage to the associated programmable logic block (e.g., block 503).

In accordance with one embodiment, configuration data values $C_1$-$C_4$ may be selected at design time, such that reduced voltages are subsequently applied to unused blocks during run time. User control signals $U_1$-$U_4$ may be selected during run time, such that reduced voltages are dynamically applied to inactive blocks at run time. Techniques for distributing multiple programmable down-converted voltages using on-chip switching voltage regulators are described in more detail in U.S. patent application Ser. No. 10/606,619, "Integrated Circuit with High-Voltage, Low-Current Power Supply Distribution and Methods of Using the Same" by Bernard J. New et al., which is hereby incorporated by reference.

In the embodiment of FIG. 5, the granularity of the voltage scaled programmable logic blocks 301-304 should be fairly large because the overhead associated with switching regulators 501-504 is significant. In an FPGA, each programmable logic block 301-304 would most likely be divided into several clusters of configuration logic blocks (CLBs). The exact size of each programmable logic block is determined by the desired trade-off among power savings, layout area overhead of the switching regulators, and the speed penalty.

Figure 6:
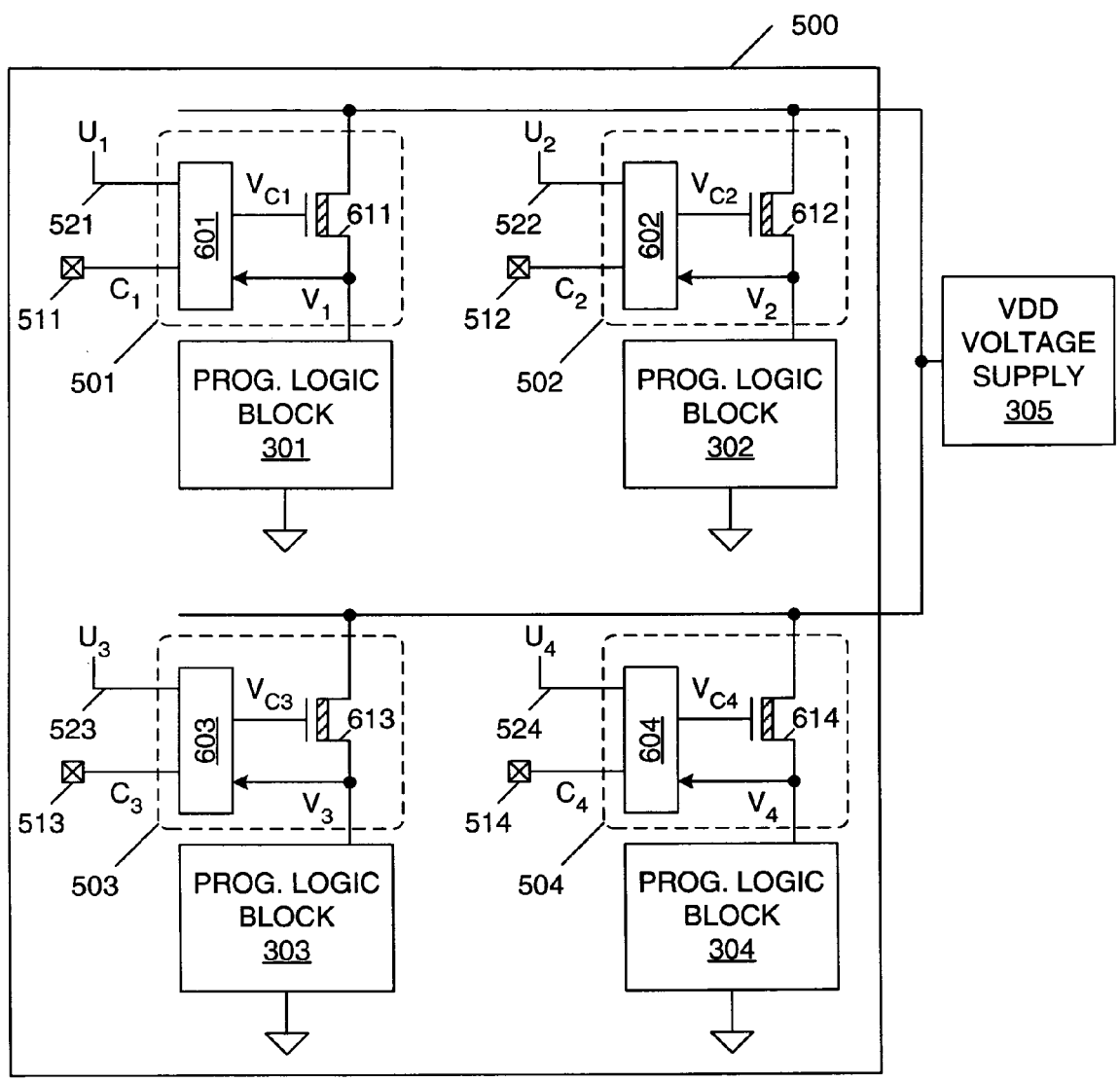
FIG. 6 is a block diagram of the PLD of FIG. 5, which shows switching regulators in accordance with one embodiment of the present invention.

FIG. 6 is a block diagram of PLD 500, which shows switching regulators 501-504 in accordance with one embodiment of the present invention. Switching regulators 501-504 include control blocks 601-604, respectively, and high-voltage n-channel transistors 611-614, respectively. High-voltage n-channel transistors 611-614 can tolerate high voltages and may have relatively thick gate dielectric layers (e.g., 50 to 60 Angstroms) and relatively wide channel regions. In some embodiments, the gate dielectric thickness of the high-voltage n-channel transistors 611-614 is approximately 4 to 6 times thicker than the gate dielectric thickness used in the programmable logic blocks 301-304. The drain of each of n-channel transistors 611-614 is coupled to the $V_{DD}$ voltage supply 305. The gates of n-channel transistors 611-614 are coupled to receive the control voltages $V_{C1}$-$V_{C4}$, respectively, from the corresponding control blocks 601-604. The sources of n-channel transistors 611-614 are configured to provide an operating voltage $V_1$-$V_4$, respectively, to programmable logic blocks 301-304, respectively. The source of each n-channel transistor 611-614 is also coupled to the corresponding control block 601-604 in a feedback configuration.

Each of n-channel transistors 611-614 forms a power switch between the $V_{DD}$ supply voltage 305 and the associated programmable logic block. Thick oxide n-channel transistors 611-614 are used to implement the power switches to ensure that a high voltage, herein referred to as $V_{BOOST}$, can be applied to the gates of n-channel transistors 611-614 when the associated programmable logic block is active. The high voltage $V_{BOOST}$ increases the drive current of n-channel transistors 611-614. In accordance with one embodiment, the high voltage $V_{BOOST}$ is about 2 to 2.5 times greater than $V_{DD}$. When the high voltage $V_{BOOST}$ is applied to the gate of one of transistors 611-614, the corresponding operating voltage $V_1$-$V_4$ is pulled up to the full $V_{DD}$ supply voltage.

When a programmable logic block (e.g., programmable logic block 301) is inactive, the associated operating voltage (e.g., $V_1$) is reduced. The operating voltage applied to the associated programmable logic block is preferably selected to be high enough to retain data stored in this programmable logic block. In one embodiment, the operating voltage is reduced to a voltage that is about one half the $V_{DD}$ supply voltage. The operating voltage is reduced by applying a low voltage $V_{STANDBY}$ to the gate of the corresponding n-channel transistor (e.g., transistor 611). In one embodiment, the low voltage $V_{STANDBY}$ is about 80 to 100 percent of the $V_{DD}$ supply voltage.

In accordance with one embodiment, each of control blocks 601-604 is independently controlled to provide either the high voltage $V_{BOOST}$ or the low voltage $V_{STANDBY}$ to the associated n-channel transistor 611-614.

For example, control block 601 is configured to receive the user control signal $U_1$ and the configuration data value $C_1$, which have been described above. If both the user control signal $U_1$ and the configuration data value $C_1$ are deactivated, then control block 601 provides a control voltage $V_{C1}$ equal to the high voltage $V_{BOOST}$ to the gate of n-channel transistor 611. As a result, an operating voltage $V_1$ equal to the $V_{DD}$ supply voltage is applied to programmable logic block 301.

However, if either user control signal $U_1$ or configuration data value $C_1$ is activated, then control block 601 provides a control voltage $V_{C1}$ equal to the low voltage $V_{STANDBY}$ to the gate of n-channel transistor 611. As a result, an operating voltage $V_1$ approximately equal to one half the $V_{DD}$ supply voltage is applied to programmable logic block 301.

To ensure that the operating voltage $V_1$ applied to programmable logic block 301 has a value of ½ $V_{DD}$ when the $V_{STANDBY}$ voltage is applied to the gate of transistor 611, the control block 601 may include a feedback mechanism that adjusts the low voltage $V_{STANDBY}$ signal until the operating voltage $V_1$ is precisely equal to ½ $V_{DD}$, or any other desired voltage.

It is well known that the gate current through a transistor typically increases by an order of magnitude for every 0.3 Volt increase in the $V_{DD}$ supply voltage. It is therefore expected that reducing the operating voltage of a programmable logic block by half (½ $V_{DD}$) will reduce the gate current through the transistors present in the programmable logic block by an order of magnitude or more. At the same time, the sub-threshold leakage of these transistors will also decrease with the reduced operating voltage. Based on earlier generation technology, the leakage current may be reduced by 70% or more when reducing the operating voltage to ½ $V_{DD}$. Simulation of a ring oscillator shows that the ring oscillator will operate properly at the lower operating voltage (½ $V_{DD}$). It can be expected the associated logic block will retain stored data using the lower operating voltage. Therefore, the proposed switching regulators are capable of achieving more than 70% reduction in leakage current without a significant increase in area penalty and without sacrificing desired functionality.

Although the invention has been described in connection with several embodiments, it is understood that this invention is not limited to the embodiments disclosed, but is capable of various modifications, which would be apparent to a person skilled in the art. For example, although the described embodiments included four programmable logic blocks, it is understood that other numbers of blocks can be used in other embodiments. Thus, the invention is limited only by the following claims.

We claim:

1. A method of operating an integrated circuit comprising:
   applying a full supply voltage to operate one or more active blocks of the integrated circuit; and
   applying a reduced supply voltage to operate one or more inactive blocks of the integrated circuit, wherein applying the reduced supply voltage comprises:
      applying a first supply voltage to a first source/drain of an n-channel transistor;
      applying a standby voltage, less than the first supply voltage, to a gate of the n-channel transistor; and
      applying the reduced supply voltage at a second source/drain region of the n-channel transistor.

2. The method of claim 1, wherein the step of applying a full supply voltage comprises:
   applying a first supply voltage to a first source/drain of an n-channel transistor;
   applying a boosted voltage, greater than the first supply voltage, to a gate of the n-channel transistor; and
   applying the full supply voltage at a second source/drain region of the n-channel transistor.

3. The method of claim 2, wherein the boosted voltage is approximately 2 to 2.5 times greater than the first supply voltage.

4. The method of claim 3, wherein the standby voltage is approximately 80 to 100 percent of the first supply voltage.

5. The method of claim 1, further comprising controlling the standby voltage such that the reduced supply voltage is about half of the first supply voltage.

6. The method of claim 1, wherein the step of applying the reduced supply voltage is performed in response to user controlled signals.

7. The method of claim 6, further comprising defining the user controlled signals during run time of the integrated circuit.

8. The method of claim 6, further comprising generating the user controlled signals in response to operating conditions of the integrated circuit during run time.

9. The method of claim 1, wherein the step of applying the reduced supply voltage is performed in response to configuration data bits stored by the integrated circuit.

10. The method of claim 9, further comprising defining the configuration data bits during design time of the integrated circuit.

11. The method of claim 1, further comprising selecting the reduced supply voltage to be a minimum voltage required to retain data stored in the one or more inactive blocks.

12. An integrated circuit comprising:
    a first voltage supply terminal configured to receive a first supply voltage;
    a plurality of programmable logic blocks; and
    a plurality of high voltage transistors, wherein each of the transistors has a gate, a first source/drain region coupled to the first voltage supply terminal, and a second source/drain region coupled to a corresponding one of the programmable logic blocks;
    a plurality of control circuits, each configured to provide a control voltage to the gate of a corresponding one of the high voltage transistors; and
    a plurality of feedback lines, each coupling the second source/drain region of each of the plurality of high voltage transistors to a corresponding control circuit.

13. The integrated circuit of claim 12, further comprising a plurality of user control terminals, each configured to provide a corresponding user control signal to a corresponding one of the control circuits.

14. The integrated circuit of claim 13, wherein each control circuit provides the control voltage in response to the corresponding user control signal.

15. The integrated circuit of claim 12, further comprising a plurality of configuration memory cells, each configured to provide a corresponding configuration data bit to a corresponding one of the control circuits.

16. The integrated circuit of claim 15, wherein each control circuit provides the control voltage in response to the corresponding configuration data bit.

17. The integrated circuit of claim 12, wherein the plurality of high voltage transistors comprise a plurality of n-channel transistors.

18. The integrated circuit of claim 17, wherein each of the plurality of high voltage transistors has a gate dielectric layer that is about 4 to 6 times thicker than gate dielectric layers present in the plurality of programmable logic blocks.

* * * * *